US010651076B2

(12) United States Patent
Lazzarino

(10) Patent No.: US 10,651,076 B2
(45) Date of Patent: May 12, 2020

(54) METHOD FOR DEFINING PATTERNS FOR CONDUCTIVE PATHS IN DIELECTRIC LAYER

(71) Applicant: IMEC VZW, Leuven (BE)

(72) Inventor: Frederic Lazzarino, Hamme-Mille (BE)

(73) Assignee: IMEC VZW, Leuven (BE)

(*) Notice: Subject to any disclaimer, the term of this patent is extended or adjusted under 35 U.S.C. 154(b) by 165 days.

(21) Appl. No.: 15/902,198

(22) Filed: Feb. 22, 2018

(65) Prior Publication Data

US 2018/0247862 A1 Aug. 30, 2018

(30) Foreign Application Priority Data

Feb. 27, 2017 (EP) .................................... 17158037

(51) Int. Cl.
*H01L 21/768* (2006.01)
*H01L 21/033* (2006.01)
(Continued)

(52) U.S. Cl.
CPC .... *H01L 21/76802* (2013.01); *H01L 21/0337* (2013.01); *H01L 21/31144* (2013.01);
(Continued)

(58) Field of Classification Search
CPC ......... H01L 21/76877; H01L 21/31144; H01L 21/76816; H01L 21/76807; H01L 21/3081;
(Continued)

(56) References Cited

U.S. PATENT DOCUMENTS 9,478,462 B1 10/2016 Wang et al.
9,691,626 B1 * 6/2017 Bouche ............. H01L 21/31144
(Continued)

FOREIGN PATENT DOCUMENTS

WO 2015/026342 A1 2/2015
WO 2016/022518 A1 2/2016

OTHER PUBLICATIONS

European Search Report, European Patent Application No. 17158037.6 dated Sep. 20, 2017, 8 pages.

*Primary Examiner* — Latanya N Crawford
(74) *Attorney, Agent, or Firm* — McDonnell Boehnen Hulbert & Berghoff LLP

(57) ABSTRACT

The present disclosure provides a method for defining patterns for conductive paths in a dielectric layer. An example method includes forming a mask layer and forming a set of mandrels, each mandrel having a pair of side wall spacers. The method also includes etching the mask layer to form a first set of trenches in the mask layer. The method further includes covering the set of mandrels with a metal oxide planarization layer, the metal oxide planarization layer filling the first set of trenches. The method also includes etching back the metal oxide planarization layer. The method also includes removing the set of mandrels by etching, thereby forming trenches in the metal oxide planarization layer, the trenches extending between the pairs of side wall spacers. The method also includes etching the mask layer to form a second set of trenches in the mask layer.

20 Claims, 7 Drawing Sheets

(51) Int. Cl.
*H01L 21/311* (2006.01)
*H01L 21/02* (2006.01)

(52) U.S. Cl.
CPC .. *H01L 21/76816* (2013.01); *H01L 21/76819* (2013.01); *H01L 21/76877* (2013.01); *H01L 21/0217* (2013.01); *H01L 21/0228* (2013.01); *H01L 21/02164* (2013.01)

(58) Field of Classification Search
CPC .......... H01L 21/3088; H01L 21/76802; H01L 21/76819
See application file for complete search history.

(56) References Cited

U.S. PATENT DOCUMENTS

| | | | |
|---|---|---|---|
| 9,704,746 B1* | 7/2017 | Shu | H01L 21/76816 |
| 9,779,943 B2* | 10/2017 | Bouche | H01L 21/76816 |
| 9,818,640 B1* | 11/2017 | Stephens | H01L 21/76816 |
| 9,818,641 B1* | 11/2017 | Bouche | H01L 21/31144 |
| 2014/0273433 A1 | 9/2014 | Lee et al. | |
| 2017/0250080 A1* | 8/2017 | Bouche | H01L 21/76816 |
| 2018/0247862 A1* | 8/2018 | Lazzarino | H01L 21/76816 |
| 2019/0206728 A1* | 7/2019 | Wallace | H01L 21/31144 |

* cited by examiner

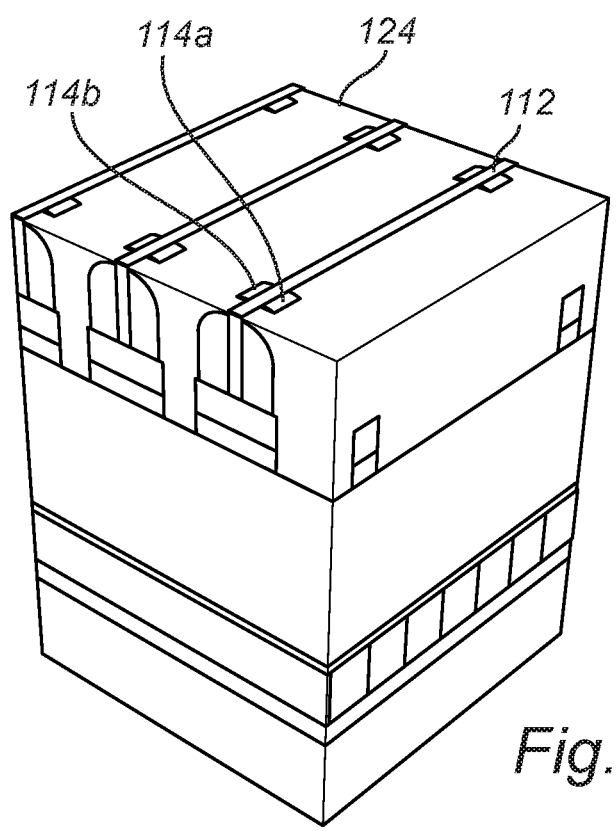

METHOD FOR DEFINING PATTERNS FOR CONDUCTIVE PATHS IN DIELECTRIC LAYER

CROSS-REFERENCE TO RELATED APPLICATIONS

The present application is a non-provisional patent application claiming priority to EP Patent Application No. 17158037.6, filed Feb. 27, 2017, the contents of which are hereby incorporated by reference.

FIELD OF THE DISCLOSURE

The present disclosure relates to a method for defining patterns for conductive paths in a dielectric layer.

BACKGROUND

Modern circuit fabrication typically includes processes of forming electrical interconnection structures for interconnecting semiconductor devices in a functioning circuit. An interconnection structure may include one or more metallization levels or tiers, which are formed above the substrate and the semiconductor devices. A metallization level includes conductive paths or lines arranged in a dielectric material layer. The dielectric material layer of a metallization level may isolate the conductive paths of the metallization level from a higher and/or a lower metallization level. Conductive paths of different metallization levels may be interconnected by conductive vias extending through the dielectric layers.

A metallization level may be formed by forming patterns including trenches and holes in a dielectric layer, and filling the trenches and holes with a conductive material. Such a process may be referred to as a dual damascene process. The process may be repeated to form a stack of metallization levels on top of each other.

Patterns may be formed in a mask layer arranged above the dielectric layer using lithographic techniques and etching. Multiple patterning techniques, such as (litho-etch)$^x$, or pitch splitting techniques, such as self-aligned double patterning (SADP) or quadruple patterning (SAQP), may be used to enable patterns with sub-lithographic critical dimensions. Multiple patterning may be combined with block techniques to enable forming of interrupted or discontinuous lines.

SUMMARY

An objective of the present disclosure is to provide an improved method for defining patterns for conductive paths in a dielectric layer. Further and alternative objectives may be understood from the following.

According to an aspect of the present disclosure, an example method for defining patterns for conductive paths in a dielectric layer is provided. The method comprises: forming a mask layer above the dielectric layer; forming above the mask layer a set of mandrels, each mandrel having a pair of side wall spacers; etching the mask layer, wherein the set of mandrels and the side wall spacers act as an etch mask, to form a first set of trenches in the mask layer; covering the set of mandrels with a metal oxide planarization layer, the metal oxide planarization layer filling the first set of trenches; etching back the metal oxide planarization layer to expose upper surfaces of the set of mandrels; removing the set of mandrels by etching, thereby forming trenches in the metal oxide planarization layer, the trenches extending between the pairs of side wall spacers; and etching the mask layer, wherein the metal oxide planarization layer acts as an etch mask, to form a second set of trenches in the mask layer.

The disclosed method enables definition, in a mask layer, of patterns for conductive paths or conductive lines in a dielectric layer of a metallization level. The patterns may be formed as trenches in the mask layer and subsequently transferred into the dielectric layer.

The position and dimension of the trenches may be established by the set of mandrels having side wall spacers. Mandrels having pairs of side wall spacers may be formed by techniques (such as multi patterning techniques) enabling sub-lithographic feature sizes.

In an example, covering the set of mandrels with a metal oxide planarization layer provides the following features:

First, as a metal oxide layer may be deposited in a self-planarizing manner, the thickness reduction required for exposing the upper surfaces of the set of mandrels may be achieved by etch back, without a preceding chemical mechanical polishing (CMP) step. This contributes to improving overall efficiency of the process.

Second, as realized by the inventor, metal oxides provide a comparably strong etch contrast with respect to materials typically used for mandrels and side wall spacers. This allows subsequent removal of the metal oxide planarization layer, while preserving or at least partially preserving the pairs of side wall spacers, which thus may be used as an etch mask once more for forming additional trenches in the hard mask. This further allows use of a single mask layer structure, as opposed to a double mask layer structure.

In an example, the metal oxide planarization layer includes TiOx, ZrOx or HfOx. The set of mandrels may be formed by amorphous silicon (a-Si) and in an example strained a-Si. The set of mandrels may alternatively be formed by SiN. The side wall spacers may be formed by a silicon oxide, for instance $SiO_2$. In other example embodiments, other combinations of materials are of course also possible.

Generally, the set of mandrels may be formed by a first material, the side wall spacers may be formed by a second material, and the mask layer may be formed by a third material, wherein the first, second, and third materials are different materials. The first material may be etched selectively from the second material. The third material may be etched selectively from the first and the second material. The first material may be etched selectively from the metal oxide planarization layer. The metal oxide planarization layer may be etched selectively from the second material. The metal oxide planarization layer may be etched selectively from the third material. In this context, a material "A" which may be etched selectively from a material "B" means that material A may be etched at a substantially greater rate than material B, in a given etch process. In other words, a feature of material A arranged adjacent to a feature of material B may be removed in an etch process without appreciably affecting the feature of material B.

By a first feature, such as a layer, a level or other structure, being formed "above" a second feature, such as a layer, a level or other structure, is hereby meant that the first feature is formed above the second feature (as seen) in a normal direction to the main surface or in-plane extension of the feature, e.g. layer or level, or equivalently in the normal direction to a substrate on which the metallization level is to be formed.

By a first feature, such as a layer, a level or other structure, being formed "on" a second feature, such as a layer, a level or other structure, is hereby meant that the first feature is formed directly on the second feature, i.e. in abutment with the second feature, or with one or more layers intermediate the first and the second feature, i.e. not in direct contact with the second feature.

By "metallization level" is hereby meant a structure including conductive paths arranged in a dielectric material layer. The method may be repeatedly performed for definition, in a mask layer, of patterns for conductive paths or conductive lines in a dielectric layer of two or more metallization levels of a stack of metallization levels.

By a "trench" in a layer (e.g., in the mask layer or in the dielectric layer) is hereby meant a recess in the layer. In an example, a trench may, at least along a portion thereof, extend in a straight line and present a uniform width.

The mask layer formed above the dielectric layer may be any layer or layer stack having the ability to withstand, and accordingly remain following, the removal of the metal oxide planarization layer. The mask layer may for instance be a non-resist based mask layer. The mask layer may be a "hard" mask layer. The mask layer may be formed by TiN.

The mask layer may be formed on the dielectric layer. The hard mask layer may be formed directly on the dielectric layer or with one or more intermediate layers between the dielectric layer and the hard mask layer.

The set of mandrels, which also may be referred to as a set of cores, may be formed by a set of parallel mandrel lines.

The set of mandrels with side wall spacers may be formed using a multiple patterning process such as SADP or SAQP.

The set of mandrels with side wall spacers may be formed directly on the mask layer or with one or more intermediate layers between the mask layer and the set of mandrels. An intermediate buffer layer, for instance of SiN, may be formed between the mask layer and the set of mandrels for facilitating forming of the set of mandrels.

According to an example embodiment, the method further comprises, prior to forming the first set of trenches, forming a (first) block mask extending across at least a subset of the set of mandrels, wherein the set of mandrels and the (first) block mask act as an etch mask (or etch masks) during the etching of the mask layer, the (first) block mask counteracting removal of a portion of the mask layer along at least a subset of the first set of trenches.

A remaining mask layer portion may hence be formed at positions between side wall spacers of adjacent pairs of mandrels of the at least a subset of the set of mandrels. By this embodiment, the at least a subset of the first set of trenches may be formed as a set of discontinuous or interrupted trenches, each trench with a first and a second trench portion on opposite sides of a remaining portion of the mask layer. Conductive lines with a tip-to-tip configuration may thereby be formed in the dielectric layer.

By forming the block mask prior to removing the set of mandrels, the block mask (due to the presence of the mandrels) may be allowed to extend farther than merely across the distance separating side wall spacers of adjacent pairs of mandrels. Especially, an overlap between the block mask and a given mandrel (which mandrel defines a position of one of the second set of trenches to be formed) will not result in formation of a non-intended remaining block portion in the one trench of the second set of trenches. The dimensional and alignment requirements for the block mask may thereby be relaxed.

The method may further comprise removing the block mask prior to covering the set of mandrels with the metal oxide planarization layer.

According to an example embodiment, the method further comprises, subsequent to removing the set of mandrels and prior to forming the second set of trenches, forming a (second) block mask extending across at least a subset of the trenches in the metal oxide planarization layer, wherein the metal oxide planarization layer and the (second) block mask act as an etch mask (or etch masks) during the etching of the mask layer, the (second) block mask counteracting removal of a portion of the mask layer along at least a subset of the second set of trenches.

A remaining mask layer portion may hence be formed at positions between side wall spacers on opposite sides of each trench of the at least a subset of trenches in the metal oxide planarization layer. By this embodiment, the at least a subset of the second set of trenches may be formed as a set of discontinuous or interrupted trenches, each with a first and a second trench portion on opposite sides of a remaining portion of the mask layer. Conductive lines with a tip-to-tip configuration may thereby be formed in the dielectric layer.

By forming the block mask prior to removing the metal oxide planarization layer, the block mask (due to the presence of the metal oxide planarization layer in the first set of trenches) may be allowed to extend farther than merely across the width of a pair of side wall spacers. The dimensional and alignment requirements for the block mask may thereby be relaxed.

This embodiment may be combined with the aforementioned embodiment including forming of the first block mask. The first block mask and the second block mask may be formed at different longitudinal positions along the mandrels/trenches in the metallization level.

The method may further comprise removing the (second) block mask subsequent to the transfer of the trenches into the mask layer.

According to an example embodiment, the method further comprises: removing the metal oxide planarization layer, wherein the first set of trenches are exposed, and transferring the first and second sets of trenches into the dielectric layer by etching the dielectric layer through the first and second sets of trenches. In other words, the first and second trenches (possibly including trenches interrupted by block portions formed as described above) may be transferred into the dielectric layer. The remaining portions of the mask layer (possibly together with any remaining side wall spacers) may act as an etch mask, counteracting etching of regions of the dielectric layer covered by the remaining portions of the mask layer.

The method may further comprise filling the trenches in the dielectric layer with a conductive material.

The trenches may be at least partially filled with a conductive material. The conductive material may be a single metal or a mixture or alloy of a metal and another material. In an example, a complete filling of the trenches allows the entire cross-sectional area, allowed by the trenches in the dielectric layer, to be filled by the conductive material to obtain a low-resistance interconnect structure.

The act of filing with a conductive material may comprise forming the conductive material also above the dielectric layer and removing the conductive material in locations outside of the trenches of the dielectric layer. The removing of excess conductive material may divide the deposited conductor into separate paths extending within the trenches of the dielectric layer.

BRIEF DESCRIPTION OF THE FIGURES

The above, as well as additional, features will be better understood through the following illustrative and non-limiting detailed description of example embodiments, with reference to the appended drawings. In the drawings like reference numerals will be used for like elements unless stated otherwise.

FIGS. 1a-1k schematically illustrate a method for defining patterns for conductive paths in a dielectric layer, according to an example embodiment.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

An example method for defining patterns for conductive paths in a dielectric layer will now be described with reference to FIGS. 1a-k.

Figure 1A:
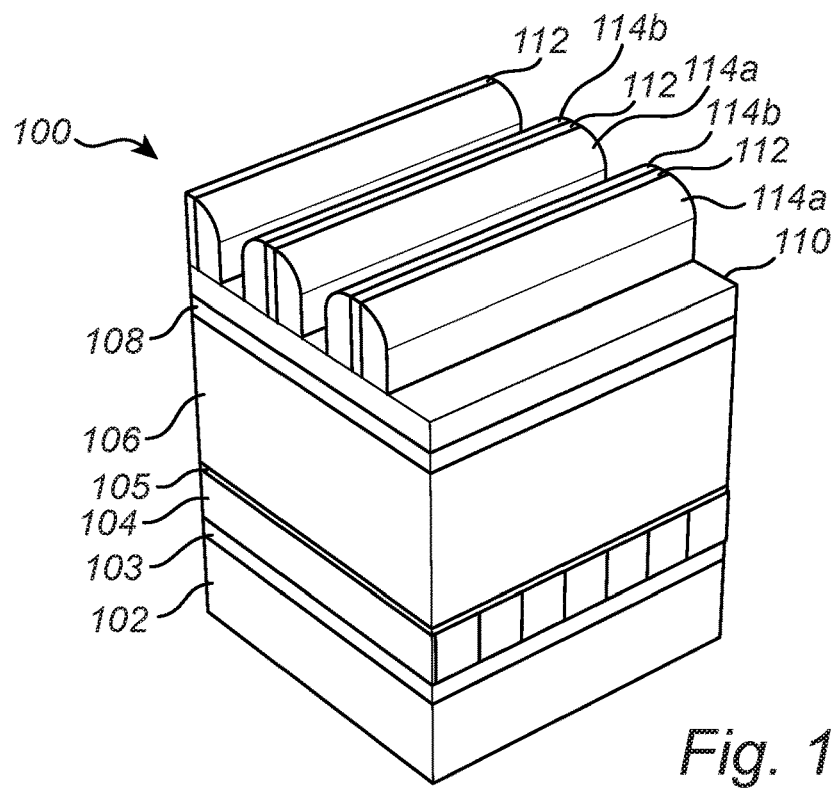

FIG. 1a shows a perspective view of a section of a semiconductor structure or intermediate device. The structure 100 may extend laterally or horizontally beyond the illustrated section. The illustrated planes of section extending through the structure 100 are common to all the figures.

It is noted that the relative dimensions of the shown elements, in particular the relative thickness of the layers, is merely schematic and may differ from practice for the purpose of illustrational clarity.

The structure 100 includes in a bottom-up direction a semiconductor substrate 102. An active device layer 103 including semiconductor devices such as transistors are fabricated on a main surface of the substrate 102. The active device layer 103 may also be referred to as a front-end-of-line portion (FEOL-portion 103). In FIG. 1a, a first metallization level 104, including conductive lines arranged in a dielectric layer, is formed above the FEOL-portion 103. A base layer 105 is formed on the first metallization level 104. The base layer 105 may include a SiCN layer.

The structure 100 includes a dielectric layer 106. The dielectric layer 106 forms a dielectric layer of the metallization level which is to be formed. The dielectric layer 106 may include a silicon oxide layer, for instance $SiO_2$, or another low-K dielectric material. Although not shown in FIG. 1a, the dielectric layer 106 may include a stack of layers of different dielectric materials, such as an interface layer and/or an oxide capping layer.

A mask layer 108 is formed on the dielectric layer 106. The mask layer 108 covers an upper surface of the dielectric layer 106. The mask layer 108 may form a hard mask layer. The mask layer 108 may be formed by a TiN-layer. The mask layer 108 may be formed by atomic layer deposition (ALD).

A set of mandrels 112 are formed on the mask layer 108. FIG. 1a shows three mandrels, however this is merely an illustrative example and typically a greater number of mandrels may be formed above the mask layer 108.

The set of mandrels 112 form elongated structures, or lines, extending in parallel to each other.

Each mandrel 112 is provided with a respective pair of side wall spacers 114a, 114b. Each pair of side wall spacers 114a, 114b is formed by a first side wall spacer 114a, formed on a first side wall surface of a mandrel 112, and a second side wall spacer 114b, formed on a second side wall surface of the mandrel 112. The first and second side wall surfaces are opposite side wall surfaces of the mandrel 112.

The gap or space between a first side wall spacer 114a on a first mandrel 112 and a second side wall spacer 114b on a second mandrel 112, next or adjacent to the first mandrel, defines the position of a trench of a first set of trenches which are to be formed in the mask layer 108. The positions of the mandrels 112 define the positions of a second set of trenches which are to be formed in the mask layer 108.

The mandrels 112 with the side wall spacers 114a, 114b may be formed using multiple patterning techniques.

According to an example SADP-process, a mandrel layer may be formed on the mask layer 108. The mandrel layer may be formed by an a-Si layer, and in an example a strained a-Si layer. Alternatively, the mandrel layer may be formed by a SiN layer. The mandrel layer may be deposited by ALD, physical vapor deposition (PVD), or some other conventional thermal deposition process.

A resist-based mask layer (not shown in FIG. 1a) may be deposited on the mandrel layer. The resist-based mask layer may be deposited in a spin-coating process. A pattern for defining the mandrels 112 may be formed in the resist-based mask layer using single or multiple exposure lithography. The pattern of the resist-based mask layer may be transferred into the mandrel layer by etching, thereby forming the mandrels 112. The mandrels 112 may thereafter be covered by a conformal spacer material layer. The spacer material layer may for instance be a silicon oxide, for instance $SiO_2$. The spacer material layer may be deposited in an ALD process. Physically separated side wall spacers 114a, 114b may be formed by anisotropically etching the spacer material layer such that the spacer material layer remains only on the sidewalls of the mandrels 112.

According to an example SAQP-process two mandrel layers may be used, a top and a bottom mandrel layer. A first set of mandrels may be formed in the top mandrel layer in similar manner as in the above-described SADP-process. A first set of side wall spacers may be formed on the first set of mandrels in similar manner as in the SADP-process. The first set of mandrels may thereafter be removed selectively from the first set of side wall spacers by etching. The bottom mandrel layer may thereafter be etched using the first set of spacers as an etch mask, wherein the pattern defined by the first set of spacers may be transferred to the bottom mandrel layer, thereby forming the set of mandrels 112 shown in FIG. 1a. The side wall spacers 114a, 114b may thereafter be formed in a corresponding manner as the first set of side wall spacers, following removal of remaining portions of the top mandrel layer.

The first set of mandrels may also be produced by a line doubling process such as the above-described SAQP-process. Although there is in principle no limit in the number of line doubling process that can be used, each doubling process however becomes more technically challenging. Hence, in practice a limit, dependent inter alia on accuracy of equipment and/or control of process conditions, does exist.

To facilitate forming of a mandrel layer above the hard mask layer 108, the structure 100 may, as shown, include a buffer layer 110 forming an intermediate layer between the mask layer 108 and the mandrel layer. A SiN buffer layer may facilitate deposition of an a-Si mandrel layer. A $SiO_2$ buffer layer may facilitate deposition of a SiN mandrel layer.

Figure 1B:
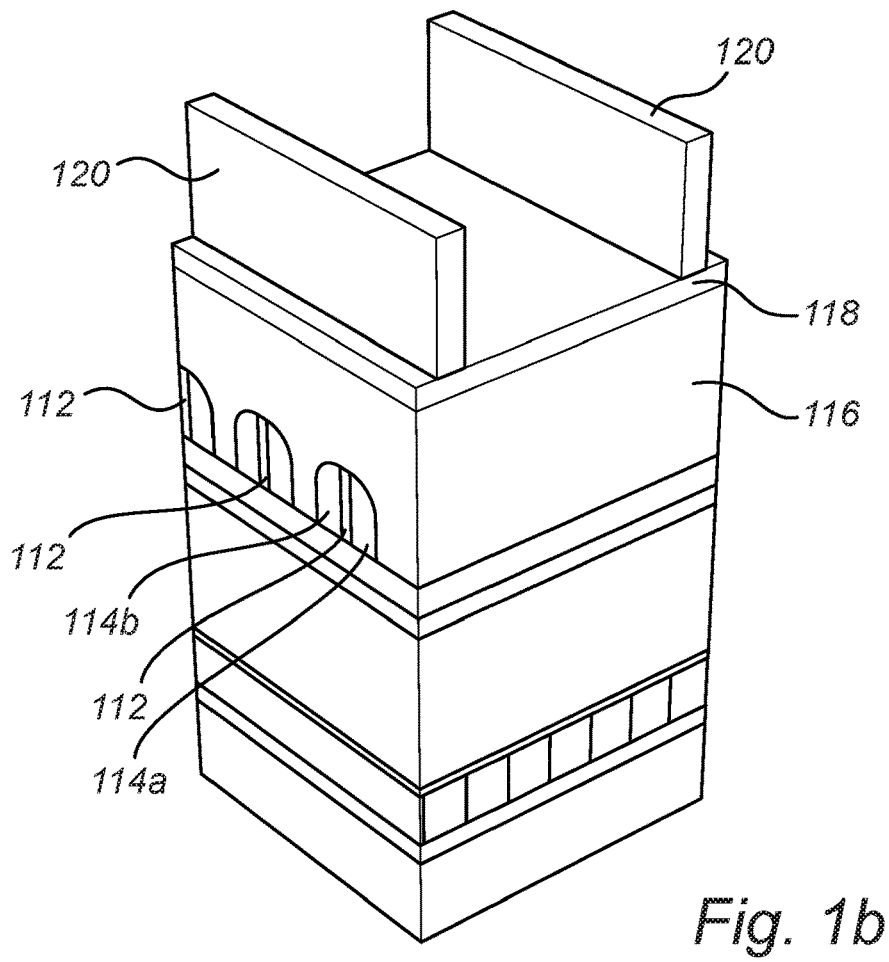

In FIG. 1b, a block mask layer 116 has been formed to cover the set of mandrels 112 and the side wall spacers 114a, 114b. The block mask layer 116 fills the gaps or spaces between side wall spacers 114a, 114b of adjacent mandrels 112. The block mask layer 116 may include an organic spin-on layer. The block mask layer 116 may be formed by a spin-on-carbon (SOC) layer.

A patterned resist-based mask layer 120 is formed on the block mask layer 116. The mask layer 120 is patterned to include at least one elongated mask portion, extending in a direction transverse to the longitudinal direction of the mandrels 112.

As shown in FIG. 1b, an intermediate layer 118 may be arranged between the block mask layer 116 and the mask layer 120. The intermediate layer 118 may include a spin-on-glass layer (SOG), a thin layer of $SiO_2$, a-Si, SiON or SiOC. An intermediate layer 118 may be used for improving the fidelity of a transfer of the pattern of the patterned resist-based mask layer 120 into the block mask layer 116.

Figure 1C:
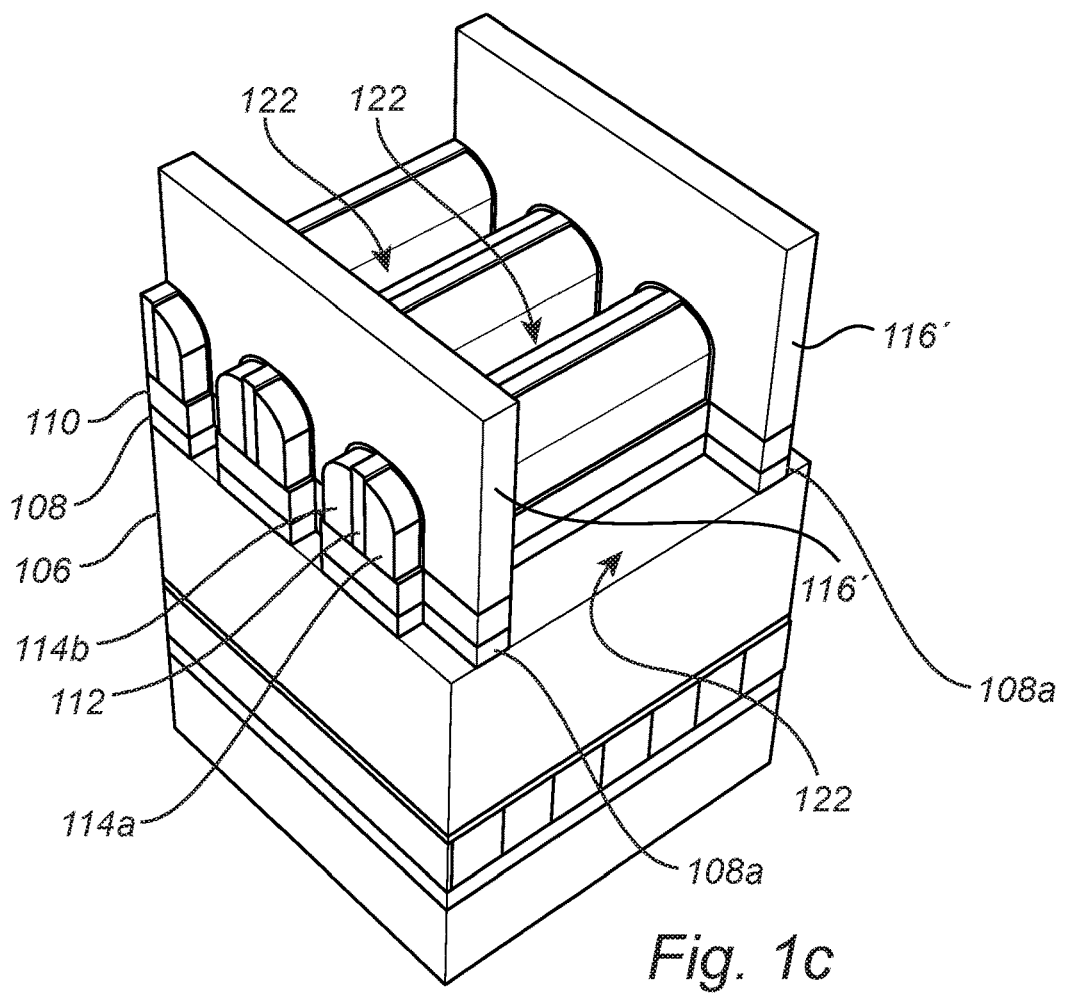

In FIG. 1c, the pattern defined by the patterned resist-based mask layer 120 has been transferred into the block mask layer 116 by etching while using the mask layer 120 as an etch mask. The mask layer 120 may thereafter be stripped, optionally along with the intermediate layer 118, if present. A first block mask 116' has been formed by the portions of the block mask layer 116 previously covered by the patterned resist-based mask layer 120. Accordingly, the first block mask 116' includes at least one elongated mask portion, extending in a direction transverse to the longitudinal direction of the mandrels 112.

Subsequent to forming the block mask 116', the pattern formed by the block mask 116', and the exposed portions of the mandrels 112 and the side wall spacers 114a, 114b is transferred into the mask layer 108 (and into the buffer layer 110 if present). The pattern transfer may be performed by etching the mask layer 108 (and the buffer layer 110) using the block mask 116' and the mandrels 112 and the side wall spacers 114a, 114b as a combined etch mask. A mask layer 108 of TiN may be etched selectively from mandrels 112 of a-Si or SiN, side wall spacers 114a, 114b of $SiO_2$ and a block mask 116' of an organic spin-on material, using a dry etch process.

As illustrated in FIG. 1c, trenches 122, which may be referred to as a first set of trenches 122, extending between side wall spacers 114a, 114b of adjacent mandrels 112, is thereby formed in the mask layer 108. Each trench 122 in the mask layer 108 is formed at a position, in the mask layer 108, below the gaps between side wall spacers 114a, 114b on adjacent mandrels 112. The trenches 122 extend in parallel to each other. A bottom surface of each trench 122 is formed by the upper surface of the dielectric layer 106.

The trenches 122 are interrupted by remaining portions 108a of the mask layer 108. The remaining portions 108a may be referred to as first block portions 108a of the mask layer 108. The block portions 108a is a consequence of the presence of the block mask 116' during the pattern transfer into the mask layer 108.

The first set of trenches 122 define the positions of trenches which are to be formed in the dielectric layer 106. The block portions 108a form interruptions in the trenches 122, allowing formation of discontinuous trenches in the dielectric layer 106 during a subsequent transfer of the first set of trenches 122 into the dielectric layer 106. The positions of the block portions 108a hence define the tip-to-tip locations for the conductive paths that are to be formed in the dielectric layer 106.

Subsequent to the pattern transfer into the mask layer 108, the block mask 116' may be removed, for instance by dry etching.

FIGS. 1b and 1c illustrate forming of a block mask 116' including two block mask portions 108a along each trench. However, it should be understood that this merely represents an example and fewer or more block mask portions may be formed in a corresponding manner, to form a desired number of trench interruptions. Also, FIGS. 1b and 1c illustrate forming of a block mask 116' extending across at least three mandrels 112. However, it should be understood that this merely represents an example and the first block mask 116' may be formed to extend across only one, only two or more than three mandrels 112.

Figure 1D:
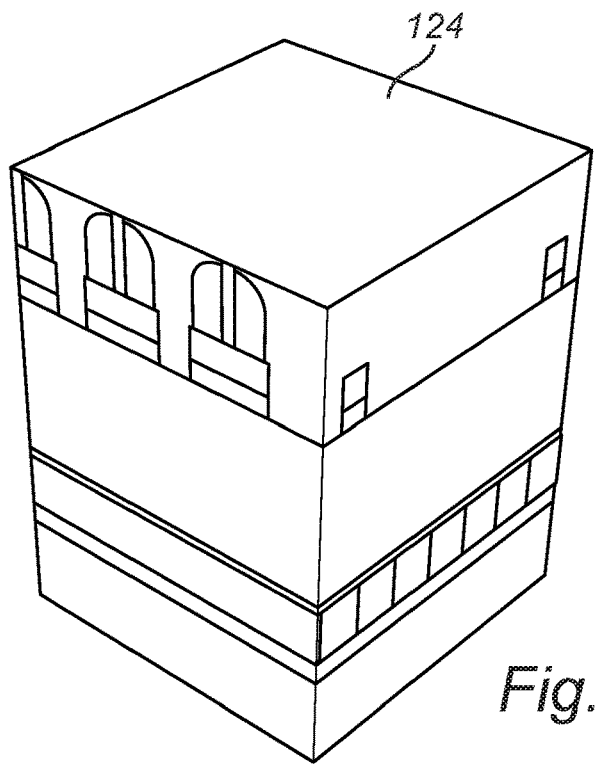

In FIG. 1d, the set of mandrels 112 have been covered with a metal oxide planarization layer 124. The metal oxide planarization layer 124 forms a self-planarization layer, planarizing the structure 100. The metal oxide planarization layer 124 fills the first set of trenches 122.

The metal oxide planarization layer 124 may be formed by a TiOx-layer, a ZrOx-layer or a HfOx-layer, or a stack of such layers. The metal oxide planarization layer 124 may be deposited by a spin-on deposition process.

In FIG. 1e, the thickness of the metal oxide planarization layer 124 has been reduced to expose an upper surface of the mandrels 112. As shown, portions of the side wall spacers 114a, 114b previously covered by the block mask 116' may also be exposed. Owing to the self-planarizing property of the metal oxide planarization layer 124, the thickness reduction may be achieved by an etch-back process, without requiring a preceding planarization step (e.g., by CMP). The etch back of the metal oxide planarization layer 124 may include a dry etch process, such as a Chlorine-based etching process. The etch-back may be performed until the upper surface of the mandrels 112 is exposed.

Figure 1G:
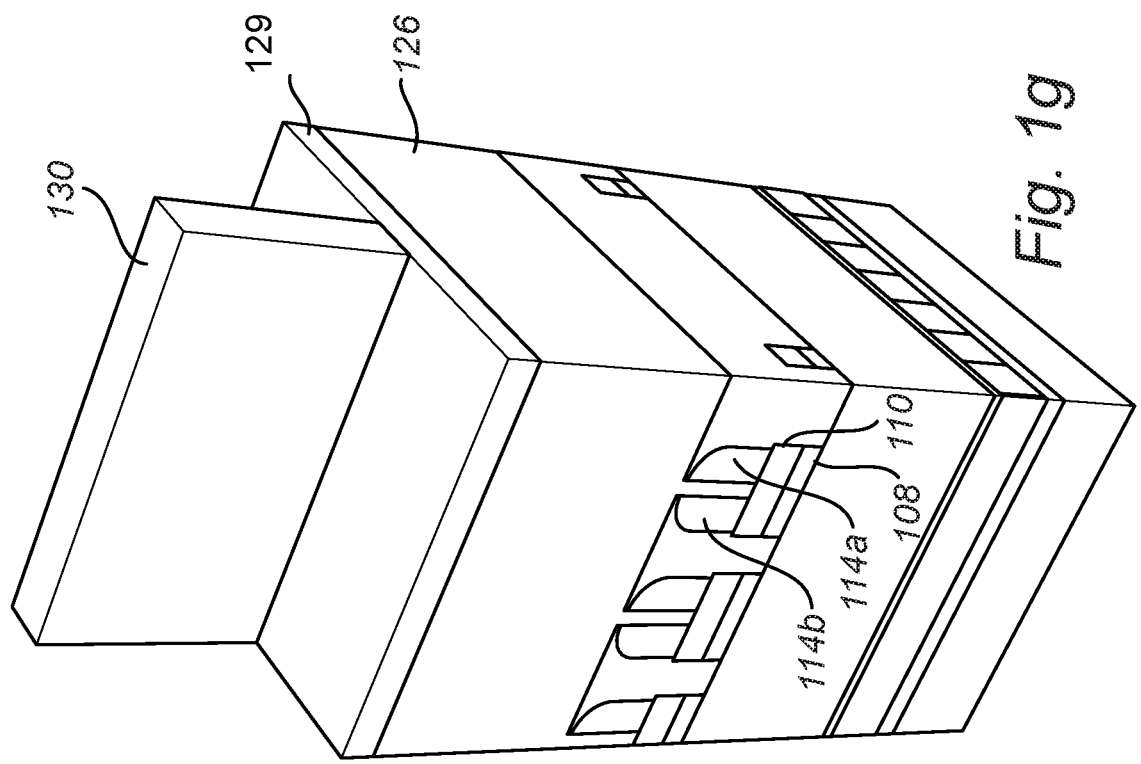
Figure 1F:
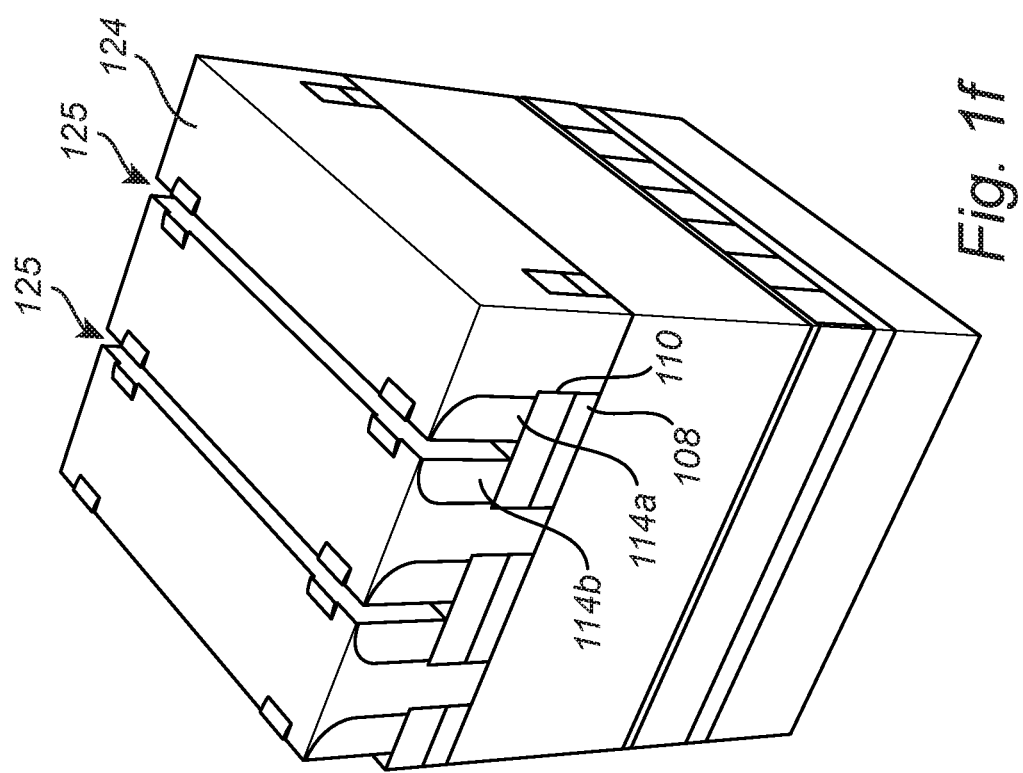

In FIG. 1f, the set of mandrels 112 has been removed by etching, selectively to the metal oxide planarization layer 124 and the side wall spacers 114a, 114b. Trenches 125 are thereby formed in the metal oxide planarization layer 124. The trenches 125 in the metal oxide planarization layer are formed at the positions previously occupied by the mandrels 112. Each trench 125 extends between a respective pair of side wall spacers 114a, 114b, which previously formed side wall spacers on opposite sides of a same mandrel 112. A bottom surface of each trench 125 is formed by an upper surface of the mask layer 108 (or buffer layer 110).

The set of mandrels 112 may be removed using a dry etching process, for instance using a $Cl_2$ or HBr based plasma. The etching of the set of mandrels 112 may be performed until an upper surface of the mask layer 108 (of buffer layer 110) is exposed.

In FIG. 1g, a block mask layer 126 has been formed to cover the metal oxide planarization layer 124. The block mask layer 126 fills the trenches 125 in the metal oxide planarization layer 124.

A patterned resist-based mask layer 130 is formed on the block mask layer 126. The mask layer 130 includes at least one elongated mask portion, extending in a direction transverse to the longitudinal direction of the (filled) trenches 125 and the side wall spacers 114a, 114b. The block mask layer 126 and the patterned resist-based mask layer 130 may be formed in a similar manner as the block mask layer 116 and the mask layer 120. Additionally, as shown in FIG. 1g, an intermediate layer 129 corresponding to the intermediate layer 118 may be arranged between the block mask layer 126 and the mask layer 130.

Figure 1H:
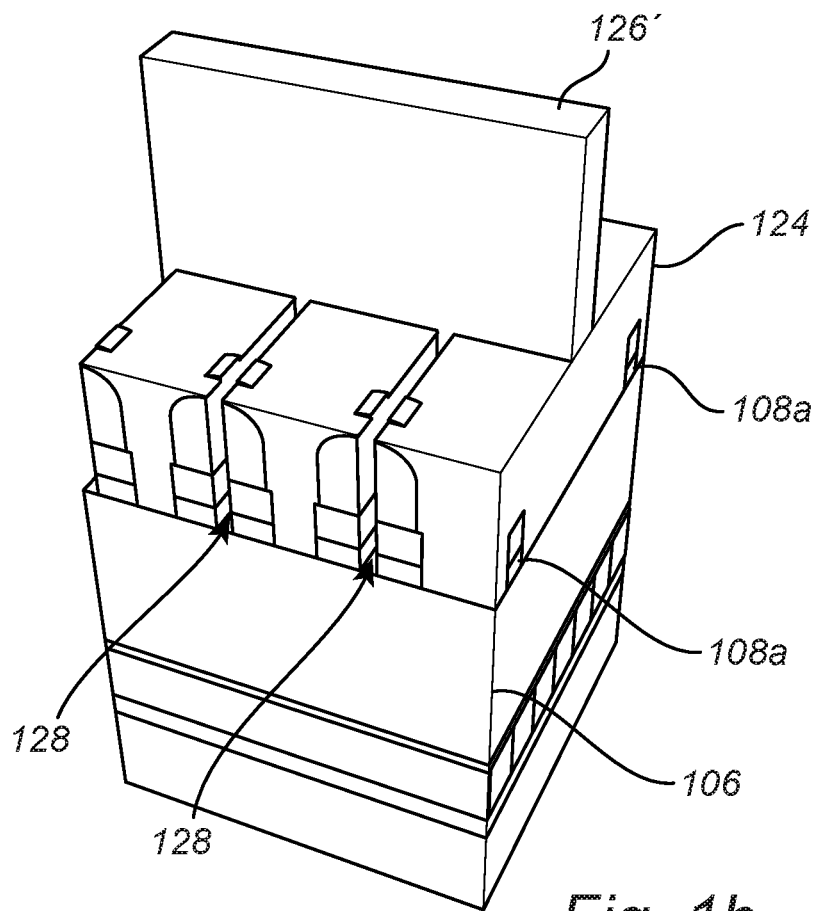

In FIG. 1h, the pattern defined by the patterned resist-based mask layer 130 has been transferred into the block mask layer 126 by etching while using the mask layer 130 as an etch mask. The mask layer 130 may thereafter be stripped, optionally along with the intermediate layer 129, if present. Portions of the block mask layer 126 exposed by the patterned resist-based mask layer 130 have been removed both from an upper surface of the metal oxide planarization layer 124 and within the trenches 125. A second block mask 126' has been formed by the portions of the block mask layer 126 covered by the patterned resist-based mask layer 130. Accordingly, the second block mask 126' includes at least one elongated mask portion, extending in a direction transverse to the longitudinal direction of the side wall spacers 114a, 114b.

Similar to the discussion regarding the first block mask 116', the illustrated number of second block mask portions 126', and the longitudinal extension thereof, is merely an example and any desired number of block mask portions 126' with any desired length dimension may be formed.

Still with reference to FIG. 1h, subsequent to forming the block mask 126', the pattern formed by the block mask 126', and the metal oxide planarization layer 124 is transferred into the mask layer 108 (and into the buffer layer 110 if present). The pattern transfer is performed by etching the mask layer 108 (and the buffer layer 110) using the block mask 126' and the metal oxide planarization layer 124 as a combined etch mask. A similar etching process as used during the first pattern transfer into the mask layer 108 may be used.

The portions of the mask layer 108 (and buffer layer 110) inside the trenches 125, which portions are exposed by the block mask 126', are accordingly removed.

As illustrated in FIG. 1h, trenches 128, which may be referred to as a second set of trenches 128, is thereby formed in the mask layer 108. Each trench 128 in the mask layer 108 is formed at a position between a respective pair of side wall spacers 114a, 114b (which previously formed side wall spacers on opposite sides of a same mandrel 112). The trenches 128 extend in parallel to each other. A bottom surface of each trench 128 is formed by the upper surface of the dielectric layer 106.

The forming of the second set of trenches 128 may be considered as a deepening or vertical extension of the trenches 125, into regions of the mask layer 108 (and buffer layer 110) inside the trenches 125 which are exposed by the block mask 126'.

The trenches 128 are interrupted by remaining portions 108b of the mask layer 108 and a corresponding above remaining portion of the buffer layer 110. The remaining portions 108b may be referred to as second block portions 108b of the mask layer 108. The block portions 108b is a consequence of the presence of the block mask 126' during the second pattern transfer into the mask layer 108. The remaining portions 108b are visible in the inset in FIG. 1j, showing (in a stage where the metal oxide planarization layer 124 and the block mask 126' have been removed) a cross section along a trench 128, wherein both block mask portions 108a and 108b are visible.

The second set of trenches 128 define the positions of trenches which are to be formed in the dielectric layer 106. The block portions 108b form interruptions in the trenches 128, allowing formation of discontinuous trenches in the dielectric layer 106 during a subsequent transfer of the second set of trenches 128 into the dielectric layer 106. The positions of the block portions 108b hence define the tip-to-tip locations for the conductive paths that are to be formed in the dielectric layer 106.

Figure 1I:
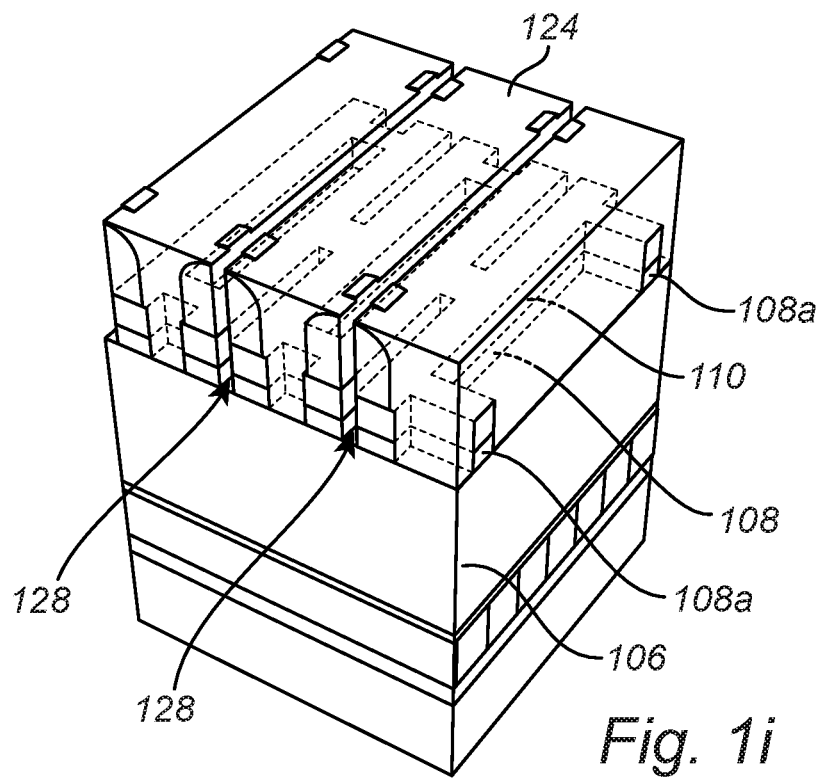

In FIG. 1i, the block mask 126' has been removed. The upper surface of the block portions 108b (of buffer layer 110) inside the second set of trenches 128 are hence exposed. The dashed lines indicate the structures which are hidden from view by the metal oxide planarization layer 124.

Figure 1J:
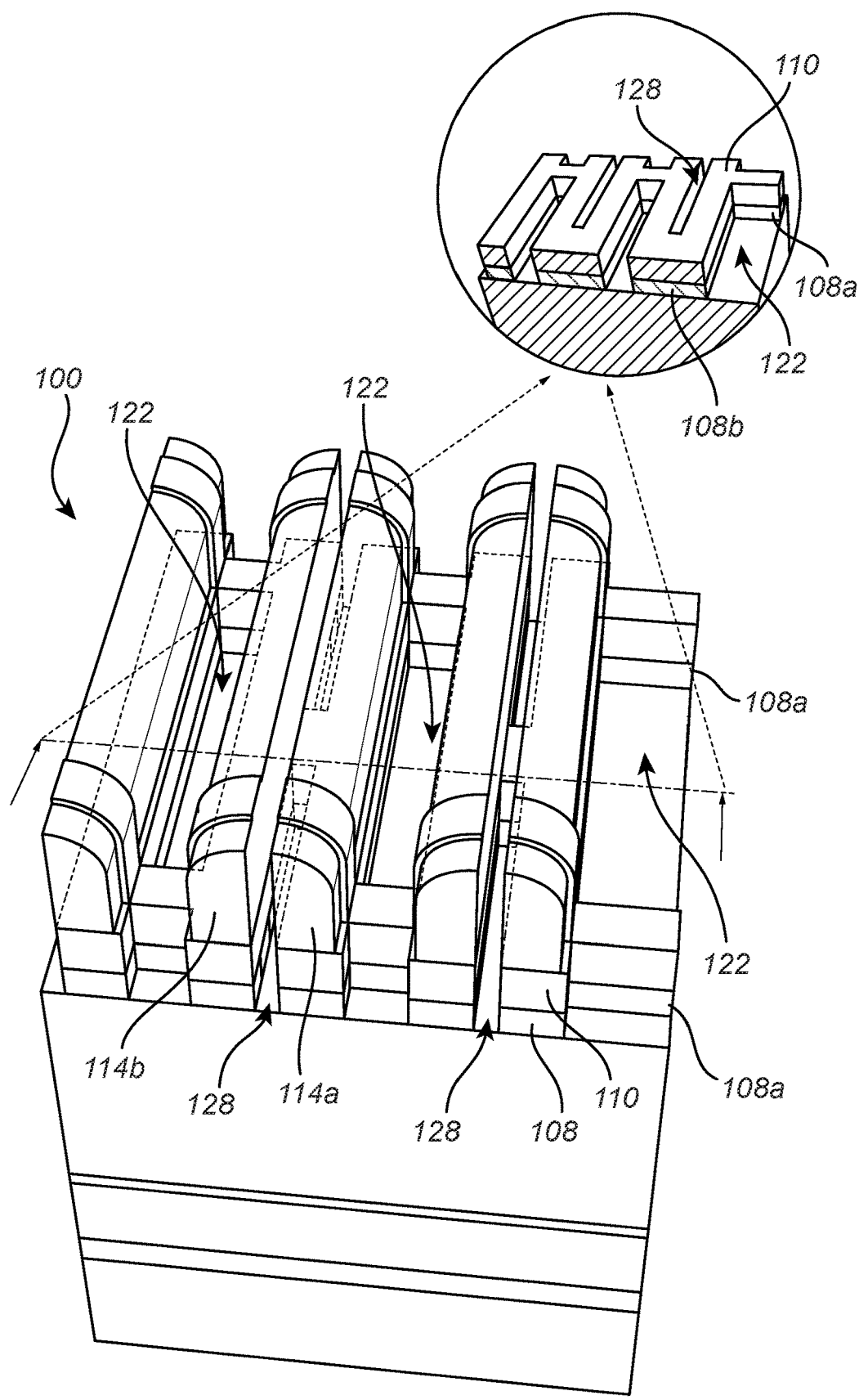

In FIG. 1j, metal oxide planarization layer 124 has been removed. The metal oxide planarization layer 124 may be removed by dry etching using $Cl_2$ or HBr based chemistry.

The resulting structure 100 hence includes the patterned mask layer 108, including the first set of trenches 122 and the second set of trenches 128. The first set of trenches 122 and the second set of trenches 128 are interleaved with each other. That is, a trench of the first set of trenches 122 is arranged between a pair of trenches of the second set of trenches 128, and vice versa.

The first set of trenches 122 includes a number of discontinuous trenches, including trench portions extending on opposite sides of first block portions 108a of the mask layer 108. The second set of trenches 128 includes a number of discontinuous trenches, including trench portions extending on opposite sides of second block portions 108b of the mask layer 108.

The structure 100 further includes the side wall spacers 114a, 114b, remaining on the mask layer 108. More specifically, the side wall spacers 114a, 114b are co-extensive with the remaining regions of the mask layer 108, excluding the block portions 108a, 108b.

Figure 1K:
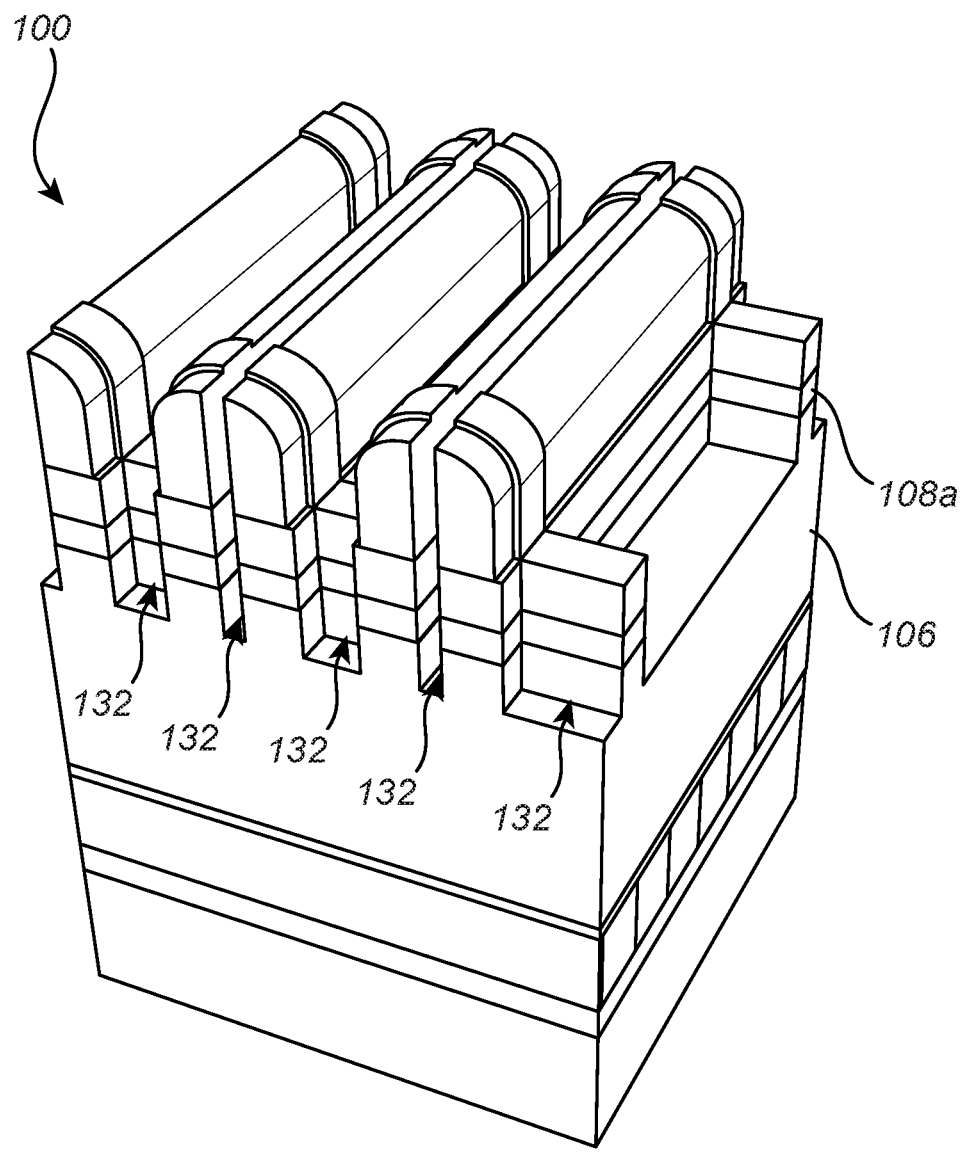

In FIG. 1k, the pattern of the mask layer 108 has been transferred into the dielectric layer 106. Trenches 132 are thereby formed in the dielectric layer 106. The pattern transfer may be performed by an anisotropic etch process. The etch process may be a plasma-based etching process. The etch process may be a reactive ion etching (ME) process. For instance, F-based plasmas may be used for selectively etching a silicon oxide dielectric layer 106 with respect to a TiN mask layer 108. Although not being the case in FIG. 1k, during the pattern transfer also the side wall spacers 114a, 114b may be consumed.

Following the pattern transfer, the mask layer 108 (and the buffer layer 110) may be removed.

The trenches 132 in the dielectric layer 106 may subsequently be filled with a conductive material to form the conductive paths or lines of the metallization level. The conductive material may be a single metal such as Cu, Al or W, or alloys thereof.

The trenches 132 may be filled with a conductive material using an electro-plating process, or a deposition process such as CVD or ALD.

The conductive material may be formed to overfill the trenches 132 and thus cover surfaces of the dielectric layer 106 outside of the trenches 132. Such excess material may subsequently be removed by planarization and/or etch back to form the final conductive paths.

The above method steps may be supplemented with conventional process techniques for via formation, in order to interconnect conducting paths of different metallization levels. Such processes are per se known to the skilled person and will therefore not be further detailed herein.

As used herein, the terminology "may" (e.g., may comprise, may be formed of, may be deposited, etc.) should be understood as meaning that in an example embodiment, the method or system comprises that described feature (e.g., comprises, is formed of, is deposited, etc.).

In the above, some embodiments of the present disclosure have been described with reference to a limited number of examples. However, as is readily appreciated by a person skilled in the art, other examples than the ones disclosed above are equally possible within the scope of example embodiments. For instance, although in the above a method has been disclosed in connection with forming of a second metallization level above an already formed first metallization level 104, the method may be applied also for forming a first metallization level, or third metallization levels or beyond. Moreover, in case no lines with a tip-to-tip configuration are desired in the dielectric layer, or in case lines with a tip-to-tip configuration only are desired between every other pair of lines, the process steps for forming the block mask 116' and/or the block mask 126' may be omitted, as desired.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for defining patterns for conductive paths in a dielectric layer, the method comprising:
    forming a mask layer above the dielectric layer;
    forming above the mask layer a set of mandrels, each mandrel having a pair of side wall spacers;
    forming a block mask extending across at least a subset of the set of mandrels;
    etching the mask layer, wherein the set of mandrels, the pairs of side wall spacers, and the block mask act as an etch mask, to form a first set of trenches in the mask layer, wherein the block mask counteracts removal of a portion of the mask layer along at least a subset of the first set of trenches;
    covering the set of mandrels with a metal oxide planarization layer, the metal oxide planarization layer filling the first set of trenches;
    etching back the metal oxide planarization layer to expose upper surfaces of the set of mandrels;
    removing the set of mandrels by etching, thereby forming trenches in the metal oxide planarization layer, the trenches in the metal oxide planarization layer extending between the pairs of side wall spacers; and
    etching the mask layer, wherein the metal oxide planarization layer acts as an etch mask, to form a second set of trenches in the mask layer.

2. The method according to claim 1, further comprising removing the block mask prior to covering the set of mandrels with the metal oxide planarization layer.

3. The method according to claim 1, further comprising:
    subsequent to etching the mask layer to form the second set of trenches, removing the metal oxide planarization layer, wherein the first set of trenches are exposed, and transferring the first and second sets of trenches into the dielectric layer by etching the dielectric layer through the first and second sets of trenches.

4. The method according to claim 3, further comprising filling the trenches in the dielectric layer with a conductive material.

5. The method according to claim 4, wherein filling the trenches in the dielectric layer with a conductive material comprises forming the conductive material also above the dielectric layer and removing the conductive material in locations outside of the trenches of the dielectric layer.

6. The method according to claim 1, wherein the metal oxide planarization layer includes $TiO_x$, $ZrO_x$, or $HfO_x$.

7. The method according to claim 1, wherein the set of mandrels is formed by a multi-patterning technique enabling sub-lithographic feature sizes.

8. The method according to claim 1, wherein forming above the mask layer a set of mandrels comprises forming the set of mandrels directly on the mask layer.

9. The method according to claim 1, wherein forming above the mask layer a set of mandrels comprises forming the set of mandrels with one or more intermediate layers between the mask layer and the set of mandrels.

10. The method according to claim 9, wherein the one or more intermediate layers comprises a SiN buffer layer or a $SiO_2$ buffer layer.

11. A method for defining patterns for conductive paths in a dielectric layer, the method comprising:
    forming a mask layer above the dielectric layer;
    forming above the mask layer a set of mandrels, each mandrel having a pair of side wall spacers;
    etching the mask layer, wherein the set of mandrels and the pairs of side wall spacers act as an etch mask, to form a first set of trenches in the mask layer;
    covering the set of mandrels with a metal oxide planarization layer, the metal oxide planarization layer filling the first set of trenches;
    etching back the metal oxide planarization layer to expose upper surfaces of the set of mandrels;
    removing the set of mandrels by etching, thereby forming trenches in the metal oxide planarization layer, the trenches in the metal oxide planarization layer extending between the pairs of side wall spacers;
    forming a block mask extending across at least a subset of the trenches in the metal oxide planarization layer; and
    etching the mask layer, wherein the metal oxide planarization layer and the block mask act as an etch mask during the etching of the mask layer to form a second set of trenches, wherein the block mask counteracts removal of a portion of the mask layer along at least a subset of the second set of trenches.

12. The method according to claim 11, further comprising removing the block mask subsequent to etching the mask layer to form the second set of trenches.

13. The method according to claim 11, further comprising:
    subsequent to etching the mask layer to form the second set of trenches, removing the metal oxide planarization layer, wherein the first set of trenches are exposed, and transferring the first and second sets of trenches into the dielectric layer by etching the dielectric layer through the first and second sets of trenches.

14. A method for defining patterns for conductive paths in a dielectric layer, the method comprising:
    forming a mask layer above the dielectric layer;
    forming above the mask layer a set of mandrels, each mandrel having a pair of side wall spacers;
    forming a first block mask extending across at least a subset of the set of mandrels;
    etching the mask layer, wherein the set of mandrels and the pairs of side wall spacers act as an etch mask, to form a first set of trenches in the mask layer, wherein the first block mask counteracts removal of a portion of the mask layer along at least a subset of the first set of trenches;
    covering the set of mandrels with a metal oxide planarization layer, the metal oxide planarization layer filling the first set of trenches;

etching back the metal oxide planarization layer to expose upper surfaces of the set of mandrels;

removing the set of mandrels by etching, thereby forming trenches in the metal oxide planarization layer, the trenches in the metal oxide planarization layer extending between the pairs of side wall spacers;

forming a second block mask extending across at least a subset of the trenches in the metal oxide planarization layer; and etching the mask layer, wherein the metal oxide planarization layer acts as an etch mask, to form a second set of trenches in the mask layer, wherein the second block mask counteracts removal of a portion of the mask layer along at least a subset of the second set of trenches.

15. The method according to claim 14, further comprising removing the first block mask prior to covering the set of mandrels with the metal oxide planarization layer.

16. The method according to claim 14, further comprising removing the second block mask subsequent to etching the mask layer to form the second set of trenches.

17. The method according to claim 14, further comprising filling the trenches in the dielectric layer with a conductive material.

18. The method according to claim 17, wherein filling the trenches in the dielectric layer with a conductive material comprises forming the conductive material also above the dielectric layer and removing the conductive material in locations outside of the trenches of the dielectric layer.

19. The method according to claim 14, wherein the metal oxide planarization layer includes $TiO_x$, $ZrO_x$, or $HfO_x$.

20. The method according to claim 14, wherein the first block mask and the second block mask are formed at different longitudinal positions along the set of mandrels.

* * * * *